United States Patent [19]

Tucker

[11] 4,169,222

[45] Sep. 25, 1979

[54] INDUCTION COOK-TOP SYSTEM AND CONTROL

[75] Inventor: Raymond M. Tucker, Cleburne, Tex.

[73] Assignee: Rangaire Corporation, Cleburne, Tex.

[21] Appl. No.: 819,164

[22] Filed: Jul. 26, 1977

[51] Int. Cl.[2] .......................... H05B 5/04; H05B 1/02; H03K 17/00; G08B 5/36

[52] U.S. Cl. .......................... 219/10.49 R; 219/10.77; 219/506; 235/92 CT; 307/239; 328/71; 340/365 C; 363/95

[58] Field of Search ........... 219/10.49, 10.77, 10.55 B, 219/445, 459, 453, 492, 493, 490, 494, 497, 499, 501, 506; 307/238, 239, 116, 252 M, 252 K; 323/101; 235/92 EA, 92 EV, 92 PE, 92 CT; 340/337, 365 C, 365 S; 328/48, 71, 5; 363/57, 95, 96, 135; 200/DIG. 1; 361/181, 399, 403, 362, 358, 359

[56] References Cited

U.S. PATENT DOCUMENTS

| | | | |
|---|---|---|---|
| 3,530,310 | 9/1970 | Adelson et al. | 340/365 C |
| 3,637,970 | 1/1972 | Cunningham | 219/10.75 |
| 3,697,716 | 10/1972 | Kornrumpf | 219/10.49 |
| 3,697,717 | 10/1972 | Kornrumpf | 219/10.49 |
| 3,710,062 | 1/1973 | Peters | 219/10.49 |
| 3,742,337 | 7/1973 | Digneffe | 323/19 |
| 3,761,667 | 9/1973 | Walden | 219/10.49 |
| 3,770,928 | 11/1973 | Kornrumpf et al. | 219/10.49 |
| 3,775,577 | 11/1973 | Peters | 219/10.49 |
| 3,781,503 | 12/1973 | Harnden et al. | 219/10.49 |
| 3,781,505 | 12/1973 | Steigerwald | 219/10.49 |
| 3,786,219 | 1/1974 | Kornrumpf et al. | 219/10.49 |
| 3,786,222 | 1/1974 | Harnden et al. | 219/10.49 |
| 3,806,688 | 4/1974 | MacKenzie et al. | 219/10.49 |
| 3,814,888 | 6/1974 | Bowers et al. | 219/10.49 |
| 3,820,045 | 6/1974 | Steigerwald | 219/10.77 |
| 3,823,297 | 7/1974 | Cunningham | 219/10.49 |
| 3,886,342 | 5/1975 | Peters | 219/10.49 |
| 3,887,781 | 6/1975 | Peters | 219/10.49 |
| 3,889,090 | 6/1975 | MacKenzie | 219/10.49 |
| 3,898,410 | 8/1975 | Peters | 219/10.49 |
| 3,925,633 | 12/1975 | Partridge | 219/10.49 |
| 3,932,801 | 1/1976 | Peters | 219/10.49 |
| 3,953,783 | 4/1976 | Peters | 219/10.49 |
| 3,974,472 | 8/1976 | Gould | 219/506 |
| 4,001,699 | 1/1977 | Denny et al. | 328/71 |
| 4,010,342 | 3/1977 | Austin | 219/10.49 |
| 4,011,428 | 3/1977 | Fosnaugh et al. | 219/10.55 B |
| 4,046,991 | 9/1977 | Sefton et al. | 219/497 |

OTHER PUBLICATIONS

IEEE Transactions on Industry Applications, "A Portable Cool-Surface Induction Cooking Appliance", Philip H. Peters, Nov./Dec. 1974.

RCA, Solid State Division, Thyristors and Rectifiers, "Characteristics and Applications of RCA Fast-Switching ASCR's", Application Note AN 6456, Henri Digneffe, Jan., 1976.

General Electric Company, Semiconductor Products Department, "A Low Cost, Ultrasonic Frequency Inverter Using a Single SCR," Note 200.49 Neville Mapham, Feb., 1967.

IEEE Transactions on Industry Applications, "The Induction Range: Its Performance and Its Development Problems" W. C. Moreland, II, Jan./Feb., 1973.

*Primary Examiner*—Bruce A. Reynolds

*Attorney, Agent, or Firm*—Richards, Harris & Medlock

[57] ABSTRACT

This specification discloses an induction heating cook-top including touch controls for controlling the operation thereof. The cook-top includes a source of direct current voltage and a first heating unit having a first induction heating coil connected to the direct current voltage source and an SCR having an anode coupled to the coil and a cathode connected to AC circuit ground. The system further includes a second heating unit including a second induction heating coil and a second SCR connected between the second coil and the source of direct current voltage. The second SCR includes a cathode connected to AC circuit ground. Circuitry is provided to apply gating pulses to both of the SCRs in order to control the heating of the induction heating coils. A touch control system is provided to control the heating level of the induction heating coils and includes heat control touch pads for increasing or decreasing the energization of the coils. Lock circuitry inhibits the heat control touch pads to prevent energization of the coils, unless an unlock switch is actuated for a predetermined time interval. The system further includes a bar graph display for indicating the amount of heat being generated by the coils and includes circuitry for increasing the length of the bar graph at a relatively high rate and decreasing the length of the bar graph at a reduced rate in order to facilitate accurate setting of the heat level of the coils.

16 Claims, 9 Drawing Figures

INDUCTION COOK-TOP SYSTEM AND CONTROL

RELATED APPLICATIONS

U.S. Pat. No. 4,149,217 filed July 26, 1977 and entitled "Touch Control Panel for Induction Heating Cook-Top", describes and claims touch control panels for use with the present invention.

FIELD OF THE INVENTION

This invention relates to cook systems, and more particularly relates to an induction cook-top system.

THE PRIOR ART

The basic principles of induction heating have been known for quite some time. It has heretofore been known to utilize power sources including rectifiers and inverters in order to drive an induction heating coil, thereby producing an alternating magnetic field which is coupled through a planar cooking surface to a cooking pan in order to provide cooking action. Examples of such previously developed induction cooking systems may be found in U.S. Pat. No. 3,637,970 entitled "Induction Heating Apparatus" issued Jan. 25, 1972; U.S. Pat. No. 3,697,716 entitled "Induction Cooking Power Converter With Improved Coil Position" issued Oct. 10, 1972 and U.S. Pat. No. 3,823,297 entitled "Load Controlled Induction Heating" issued July 9, 1974. It has also been known to utilize touch control devices and bar graphs to control the operation of such induction cooking devices.

However, problems have arisen in prior induction cooking systems wherein several induction heating coils are utilized. In prior multicoil systems, each of the inverters and induction heating coils have generally been connected in parallel, thereby often creating problems in overshoot, ringing and the like during the application of gating pulses to the inverters. Moreover, prior touch control systems have often been relatively complex and difficult to utilize, and have often not provided sufficient safety features to prevent unauthorized accidental energization of the heating coils. Power bar graph display systems have often been difficult to accurately adjust and therefore the individual burners of prior systems have not been able to be accurately adjusted to the desired heat levels.

SUMMARY OF THE INVENTION

In accordance with the present invention, an induction cook-top system is provided which substantially eliminates or reduces the problems heretofore present in prior multicoil induction cook-tops utilizing touch control systems and heat control bar graphs.

In accordance with the present invention, an induction heating system includes a source of direct current voltage. A first heating unit includes a first induction heating coil connected to the source of direct current voltage and further includes a first semiconductor switch having a first terminal coupled to the first coil and a second terminal connected to AC circuit ground. A second heating unit includes a second induction heating coil and a second semiconductor switch connected between the second coil and the source of direct current voltage. The second switch includes a terminal connected to AC circuit ground. Circuitry applies gating pulses to the first and second switches in order to drive the heating coils.

In accordance with a more specific aspect of the present invention, an induction cooking system includes a source of direct current voltage. A first induction heating coil is connected at a first terminal to receive the direct current voltage. A first source of gating signals is applied to the gate of a first semiconductor which includes an anode coupled to a second terminal of the heating coil. The first switch further includes a cathode connected to AC circuit ground. A second source of gating signals is applied to the gate of a second semiconductor switch. The second switch includes a cathode terminal connected to receive the direct current voltage and also coupled to AC circuit ground. A second induction heating coil is connected by a first terminal to AC circuit ground and is coupled at a second terminal to the anode of the second semiconductor switch.

In accordance with another aspect of the invention, a control system for the present induction heating coil includes circuitry for electrically energizing the coil. Heat control circuitry actuates and controls the energizing circuit in order to vary the energization of the heating coil. Lock circuitry inhibits the heat control circuitry to prevent energization of the coil. An unlock switch must be actuated for a predetermined time interval in order to disable the lock circuitry to enable operation of the heat control circuitry.

In accordance with a more specific aspect of the invention, a touch control system for an induction heating coil includes circuitry for electrically energizing the coil. A first touch control pad may be touched to increase the output of the energizing circuitry to raise the heating level of the coil. A second touch control pad may be touched to decrease the output of the energizing circuitry to lower the heating level of the coil. An unlock touch control pad must be touched for a predetermined time period before the operation of the first and second touch control pads is enabled.

In accordance with yet another aspect of the invention, a cook-top bar graph display for indicating heat includes a burner coil adapted to be energized to provide heat. A source of electrical signals is connected to apply electrical energy to energize the coil. Structure is provided to raise and lower the electrical energy applied to the coils from the source. A bar graph is responsive to the raising and lowering structure in order to display a bar having a length representative of the electrical energy applied to the coil. Circuitry causes the bar graph to be increased in length at a faster rate than the bar graph is descreased in length in order to facilitate accurate settings of the heat level of the burner.

DESCRIPTION OF THE DRAWINGS

For a more complete understanding of the present invention and for further objects and advantages thereof, reference is now made to the following description taken in conjunction with the accompanying Drawings, in which.

DESCRIPTION OF THE PREFERRED EMBODIMENT

Figure 1:
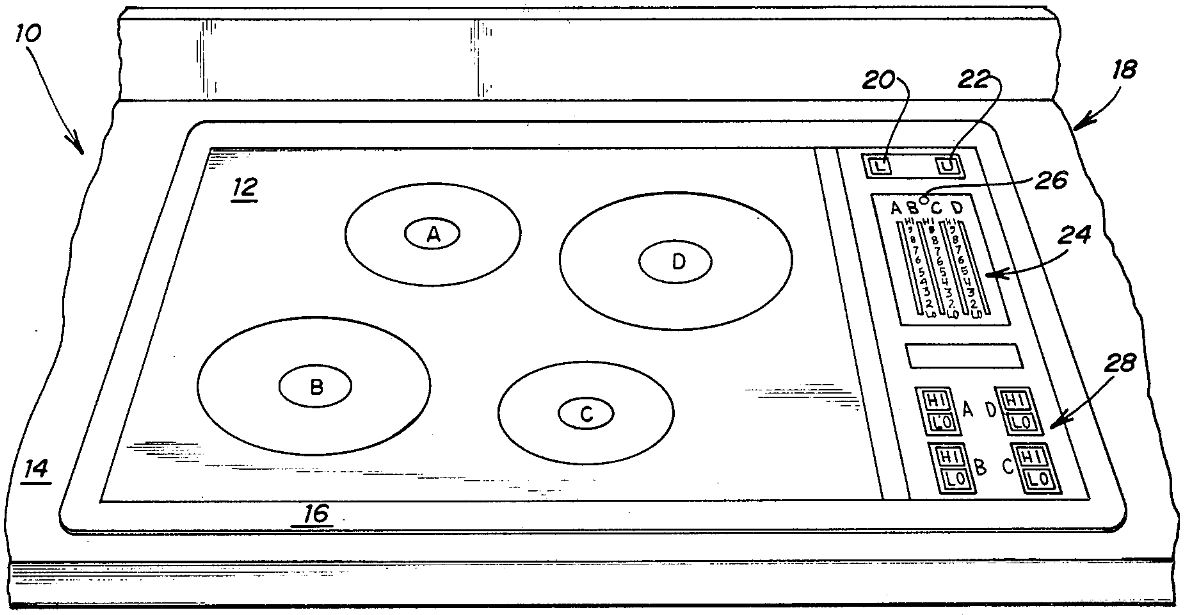
FIG. 1 is a perspective top view of a cook-top utilizing a touch control panel according to the present invention.

Referring to FIG. 1, a perspective view is presented of an induction cook-top surface identified generally by the numeral 10. The surface includes a rectangular planar surface 12 having four cooking units or burners identified as A, B, C and D provided thereon. Cooking units A and C are smaller than cooking units B and D in order to enable the accommodation of different size cooking utensils. Surface 12 comprises a suitable ceramic or material able to withstand high temperatures. Circular indicia are formed in the ceramic surface to denote the cooking units A-D which are above the four induction heating coils, not shown in FIG. 1, which are located beneath the ceramic surface 12.

The ceramic surface 12 is maintained in place within a conventional kitchen counter 14 by a stainless steel mounting rim 16. A control panel for the present oven is generally identified by the numeral 18 and includes touch control areas or pads which provide control of the cooking units A–D when the operator places a finger in contact with a designated surface. The touch controls illustrated in FIG. 1 comprise merely indicia formed on a glass plate and do not require physical depression by the operator.

Referring to the control panel 18, a LOCK pad 20 and an UNLOCK pad 22 are provided at the upper portion of the control panel. A bar graph display heat indicator 24 comprises four parallel bar graph areas labeled A, B, C and D, each corresponding to one of the cooking units A–D. As will be subsequently described, the bar graph displays 24 provide a visual indication of the amount of heat desired for each of the cooking units A–D. An indicator light 26 provides a visual indication when one or more of the cooking units is energized.

Four burner controls generally identified by numeral 28 are labeled A, B, C and D to correspond with the four cooking units or burners. Each of the burner controls has a high and a low pad area which may be touched by the operator in order to set the heat indicator at a desired level.

In operation of the cook-top surface 10, the burner controls 28 are initially locked in an off position. The operator's finger is initially placed on the UNLOCK touch control pad 22 for a predetermined time interval, such as one or two seconds, until the indicator light 26 becomes illuminated. When the indicator light 26 comes on, the burner controls 28 may be operated. Prior to illumination of the indicator light 26, the burner controls 28 cannot be operated to control the cook top.

Each of the burner controls 28 includes a HI and a LO touch control area or pad which controls the operation of a cooking unit having the same relative location as the burner control. For example, to turn on the left rear cooking unit A, the HI area or pad next to the letter A on the burner controls 28 is lightly touched with one finger by the operator. No pressure or depression by the finger of the operator is required. The bar graph display 24 marked "A" will become illuminated and display a colored bar beginning at the bottom of the bar graph area. The length of the colored bar will be dependent upon the length of time the operator's finger is held on the HI pad and indicates the relative amount of heat being supplied by the cooking unit A. The bar rises at a relatively fast rate when the HI pad is touched. On the bar graph display, the LO indication indicates minimum heat, while the HI indication indicates maximum heat. A setting of 5 on the bar graph display indicates medium heat.

The length of the display bar increases as long as the operator's finger is held on the HI pad, until the bar reaches the top of the bar graph labeled HI. The length of the bar display stops increasing whenever the operator's finger is removed from the HI pad. To decrease the length of the bar and thus the amount of heat being supplied by the cooking unit A, the LO pad for the "A" cooking unit is touched with the operator's finger. The bar length and the heat applied to the cooking unit "A" will decrease as long as the operator's finger is held on the LO pad until the bar length reaches the LO position. The bar decreases in length at a much slower rate than it rises, thus enabling the bar to be very accurately set at the desired level.

The heat applied from each of the cooking units B–D may be regulated in a similar manner by touching of the HI and LO pads of the respective positions on the burner controls 28.

In order to turn a cooking unit completely off, the operator touches both the HI and LO pads for that cooking unit at the same time by placing a finger on each pad. The lighted bar on the bar graph display 24 for that cooking unit will become immediately extinguished and the heat for that cooking unit will be completely turned off. Touching the LOCK pad 20 with a finger will cause all controls to be locked and each burner will remain at its heat setting at that time. Touching any of the burner controls 28 will have no effect as long as the cook-top is in the LOCK mode. In order to restore operation from the LOCK mode, the operator momentarily touches the UNLOCK pad 22.

When the cook-top surface 10 is turned on by touching the UNLOCK pad for one or two seconds, the cook-top and its controls will remain on until approximately three minutes after all cooking units A–D have been turned off. The cook-top will then automatically turn itself off and the on indicator 26 will become extinguished. To subsequently operate the burner controls 28, it will then be necessary for the operator to again turn the cook-top 10 on by touching the UNLOCK pad 22 for the prescribed time interval.

The present control panel provides numerous safety features. The system is automatically locked in the off position when power is initially applied to the system and the system cannot be operated unless the UNLOCK pad 22 is touched for the proper time duration. Each of the cooking units A–D may be turned off immediately by touching both the HI and LO pads associated with that cooking unit simultaneously. Due to the present inductive heating design, heat is immediately extinguished and the present system does not retain heat which could cause serious burns.

As will be subsequently discussed, the cooking units A–D will not operate unless a proper cooking pan is placed on the cooking unit. If the cooking unit is turned on with an improper pan or with no pan on the cooking unit, the bar graph display 24 for that cooking unit will flash until the proper pan is put on the cooking unit. During the flashing of the heat indicator, no heat is generated from the cooking unit. If a pan is removed from the cooking unit during the cooking operation, the cooking unit will automatically quit heating and the heat indicator will flash. If the pan is returned to the heating unit within about 20 seconds after removal, the heating unit will resume heating. Otherwise, at the end of approximately 20 seconds, the heating unit will return to the off state and the bar graph display 24 will terminate flashing.

Each heating unit is equipped with a sensor which will turn the heating unit off if a maximum safe operating temperature is exceeded, such as would occur if a pot boiled dry. When the cook-top 10 is turned on by holding of a finger on the UNLOCK pad, a cooking unit must be turned on within about 40 seconds or the cook-top surface 10 and its controls will automatically turn off.

The control panel 18 of the present invention is constructed to minimize fabrication expense while providing ease of maintenance. In previously developed touch control systems for ovens, a glass panel was provided with tin oxide pads on the outer surface and silver ceramic pads bonded to the interior surface. Circuitry was then required to be soldered to the silver ceramic.

Figure 2:
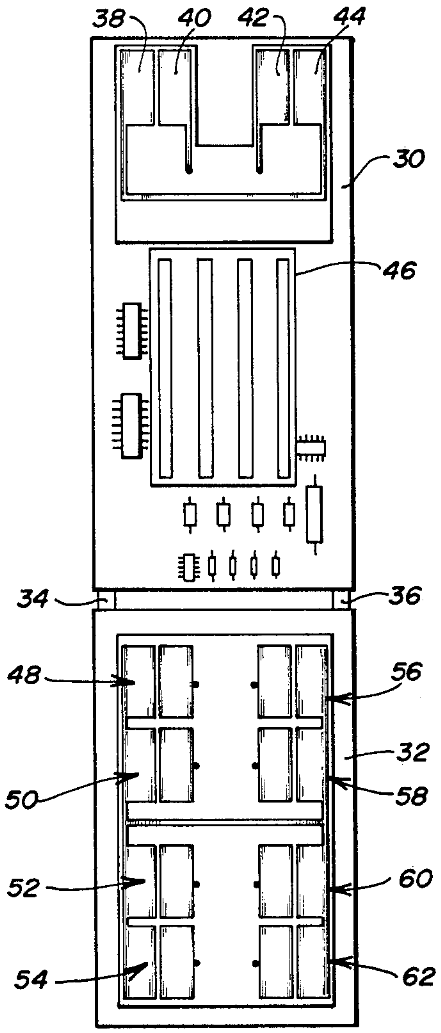
FIG. 2 is a top view of the printed circuit board of the invention.

With the present invention, as illustrated in FIGS. 2–6, the forming of a silver ceramic layer on the underside of the glass control panel is not required. As shown in FIG. 2, a pair of printed circuit boards 30 and 32 are mounted on a pair of spaced apart rails 34 and 36. Printed circuit board 30 includes a pair of copper regions 38 and 40 and a second pair of copper regions 42 and 44. These copper regions 38–44 are interconnected in the manner shown and are connected to electrical circuitry to be subsequently described in order to enable sensing of the presence of an operator's finger.

A bar graph display 46 is mounted on a printed circuit board 30 and includes four elongated bar graphs which may be illuminated by use of the known glow transfer principle. The bar graph display 46 is interconnected to suitable electrical circuitry to be subsequently described in order to display the desired heat for the cooking units A–D. The bar graph display may comprise, for example, the bar graph display described and shown in the publication entitled "Bar Graph Display for Instruments", Burroughs Application Notes, Bulletin No. BG101, February 1974, or may comprise the bar graph display such as the type BG12201-2 display manufactured and sold by Burroughs Corporation of Plainfield, New Jersey.

Printed circuit board 32 includes eight pairs of adjacently disposed copper burner control pads or areas 48–62 which are connected to suitable electrical control circuitry to be subsequently described.

Figure 3:
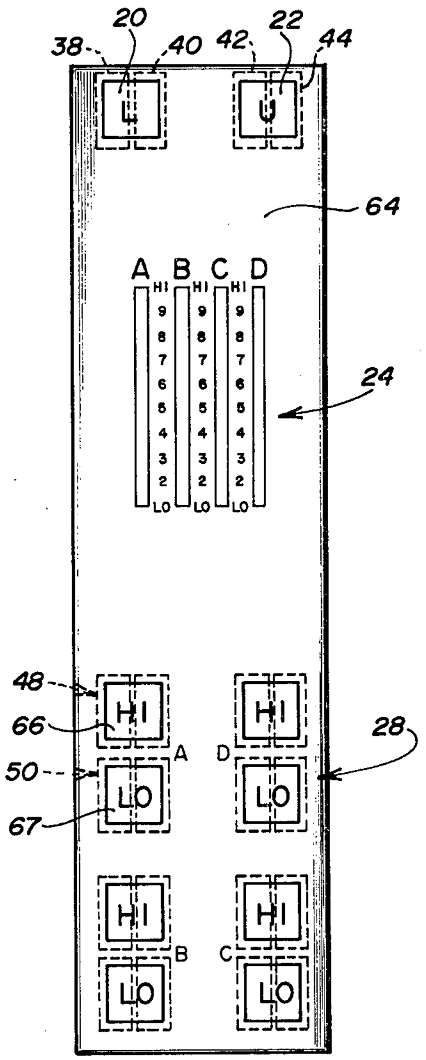
FIG. 3 is a top view of the glass touch control panel.

FIG. 3 illustrates a rectangular glass panel having indicia formed thereon and also including a plurality of discrete areas of tin oxide formed thereon. The rectangular LOCK pad 20 is formed from a thin film of tin oxide and contains the indicia L to indicate the LOCK pad previously described in FIG. 1. Similarly, the UNLOCK pad 22 is formed from tin oxide on the outer layer of the glass panel 64. Indicia for the bar graph display 24 previously described is also formed on the glass panel 64 and includes four rectangular areas, each of which correspond to one of the four bar graphs.

The glass panel 64 is adapted to be directly placed above the printed circuit boards 30 and 32 shown in FIG. 2. Consequently, the LOCK pad 20 is disposed directly and symmetrically over the copper regions 38 and 40 in the manner illustrated. Similarly, the UNLOCK pad 22 is disposed symmetrically above the copper regions 42 and 44 in the manner shown.

Tin oxide layers also form the eight HI and LO pads forming the burner control 28 previously described. For example, the HI burner control pad 66 for cooking unit A is centered above the two copper areas 48 previously shown in FIG. 2. The LO pad 67 is centered above copper areas 50. Similarly, the remaining HI and LO burner control pads are disposed above corresponding ones of the copper regions 52–62 shown in FIG. 2 when the glass panel 64 is disposed above the printed circuit boards 30 and 32.

Figure 4:
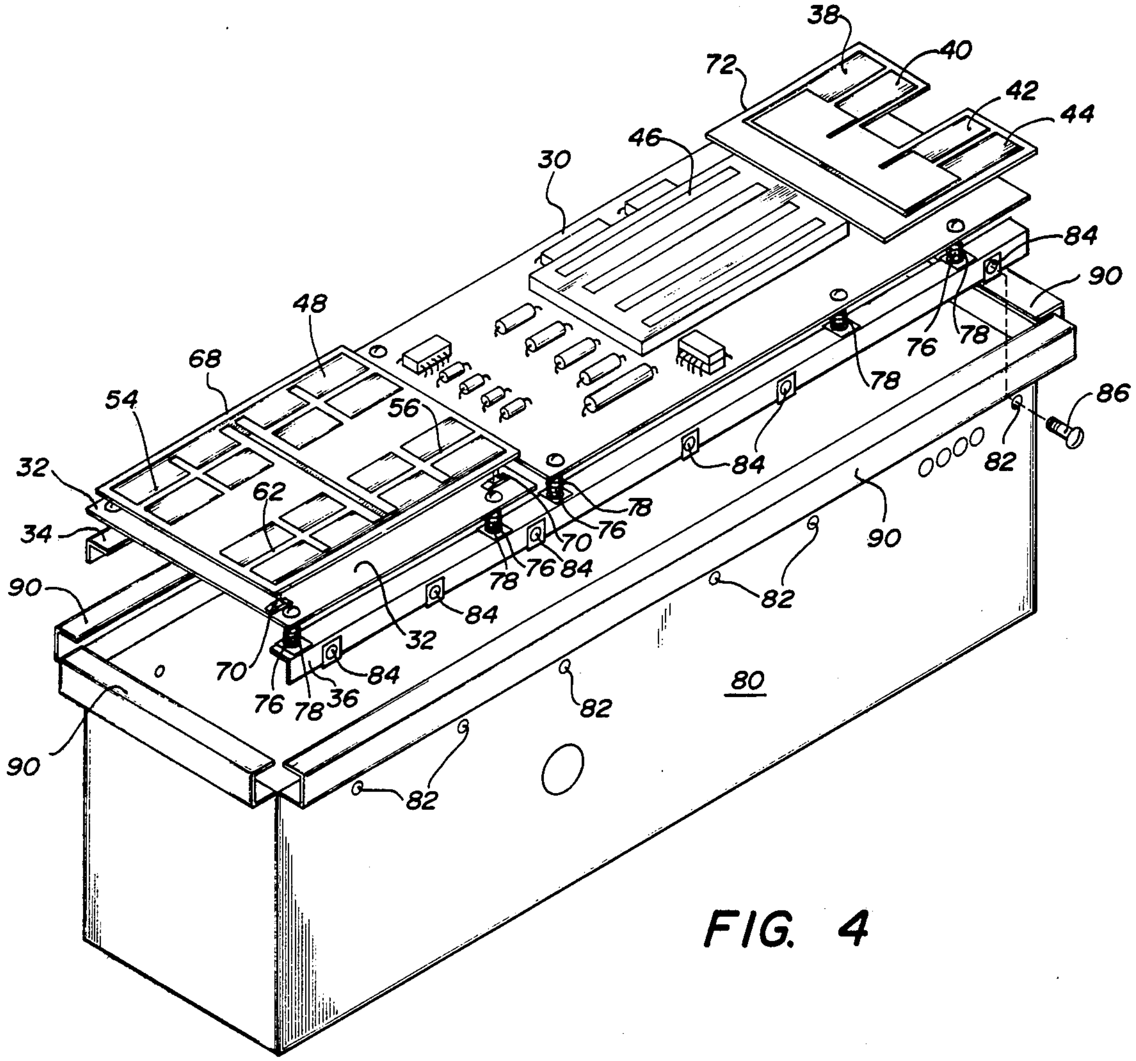
FIG. 4 is a perspective exploded view illustrating the mounting structure for the printed circuit board of the touch control system.

FIG. 4 is an exploded view illustrating the support structure for the printed circuit boards 30 and 32. The regions 48–62 are formed from copper deposited upon a printed circuit board 68. Board 68 is spaced above printed circuit board 32 and is supported by pedestals or spacers 70 made from insulating plastic material. Similarly, the copper regions 38–44 are formed on a printed circuit board 72 which is supported above the surface of printed circuit board 30 by insulating pedestals. The boards 68 and 72 are fixed relative to printed circuit board 32 by electrical connections and components.

The printed circuit boards 30 and 32 are attached to L-shaped rails 34 and 36 by a plurality of insulating screws 76. The ends of screws 76 are threaded and are fixedly received within threaded apertures within the rails 34 and 36. The upper portions of the screws 76 are not threaded and are slidably received in apertures in the printed circuit boards 30 and 32, thereby allowing a limited amount of movement of the printed circuit boards 30 and 32 relative to the rails 34 and 36. Springs 78 continuously bias printed circuit boards 30 and 32 against the heads of the screws 76. However, a force may be exerted upon the printed circuit boards 30 and 32 sufficient to overcome the springs 78 and thus allow a limited amount of movement between the printed circuit boards 30 and 32 and the rails 34 and 36.

Rails 34 and 36 are adapted to be received within a metal housing 80 having screw apertures 82 formed along the sides thereof. Each of the rails include threaded apertures 84 formed along the sides thereof and adapted to be mated with apertures 82. Bolts or screws 86, only one of which is shown for clarity of illustration, may then be disposed through the mated apertures 82 and 84 and tightened in order to firmly affix the rails 34 and 36 within the interior of the metal housing 80. Flanges 90 are formed about the upper lip of the housing 80 and are provided with a U-shaped cross-section in order to receive the glass panel shown in FIG. 3. The springs 78 bias the printed circuit boards against the underside of the glass panel 64.

Figure 5:
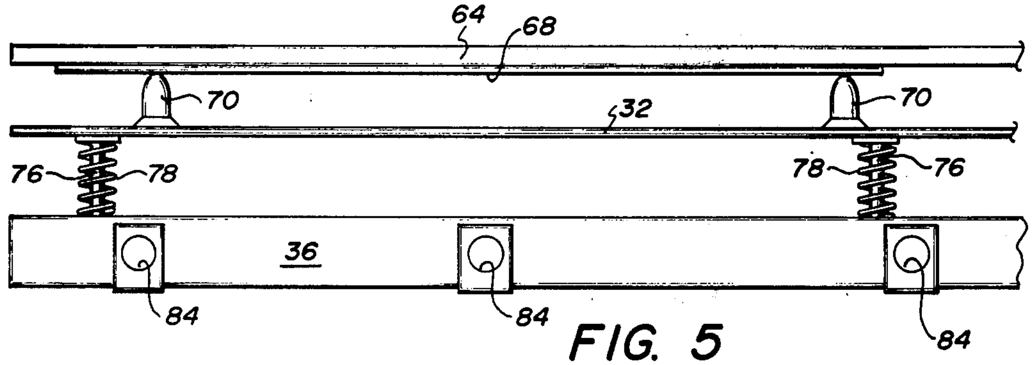
FIG. 5 is a side view of a portion of the printed circuit board mounting structure.

Referring to FIG. 5, a side view of a portion of the assembly of FIG. 4 is illustrated. FIG. 5 illustrates the side rail 36 having apertures 84 therein for attachment to the side walls of the housing 80. The plastic screws 76 extend into threaded engagement with the side rail 36, with the heads of the screws abutting against the top surface of the printed circuit board 32. The plastic spacers 70 are shown as supporting the printed circuit board 68 in the desired position in an abutting relationship against the underside of the glass panel 64. In FIG. 5, the components interconnected between the printed circuit boards 32 and 68 are omitted for clarity of illustration. However, as previously noted, wires are soldered between components on the printed circuit boards 32 and 68 in order to interconnect the boards together. Due to the fact that the boards are continually biased against the underside of the glass panel 64, no strain results on the wires interconnecting the printed circuit boards 32 and 68.

Figure 6:
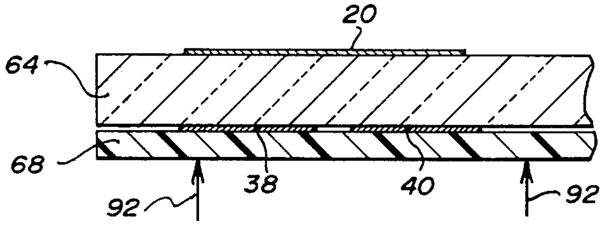
FIG. 6 is a sectional view illustrating the various conductive and insulating layers of the touch control circuit of the invention.

FIG. 6 is a sectional, somewhat diagrammatic, view of the printed circuit board 68 shown in its abutting arrangement with the underside of the glass panel 64. As previously noted, the glass panel 64 includes a tin oxide LOCK pad 20 formed on the upper portion thereof. Copper pads 38 and 40 are formed by suitable deposition technique on the upper surface of the printed circuit board 68. Due to the biasing force provided by the springs 78, illustrated diagrammatically by the arrows 92, the printed circuit board 68 is continually maintained against the underside of the glass panel 64. The copper pads 38 and 40 are thus maintained in the desired location beneath tin oxide LOCK pad 20.

This structure provides the equivalent of previously developed structure wherein deposition on both sides of a glass panel has been required. Yet, the present technique is less expensive to construct and assemble, while providing ease of maintenance and repair. The theory of operation of the touch control technique is known, and operates due to electrical coupling between the tin oxide LOCK pad 20 and the copper pads 38 and 40. Electrical circuitry, to be subsequently described, is interconnected to the copper pads 38 and 40 in order to sense the contact of a human finger upon the tin oxide LOCK pad 20. The presence of a human finger causes grounding of an electrical signal applied across the copper pads 38 and 40, thereby providing a logic indication which is sensed by the circuitry to provide logic controls in the manner to be shown.

Figure 7:
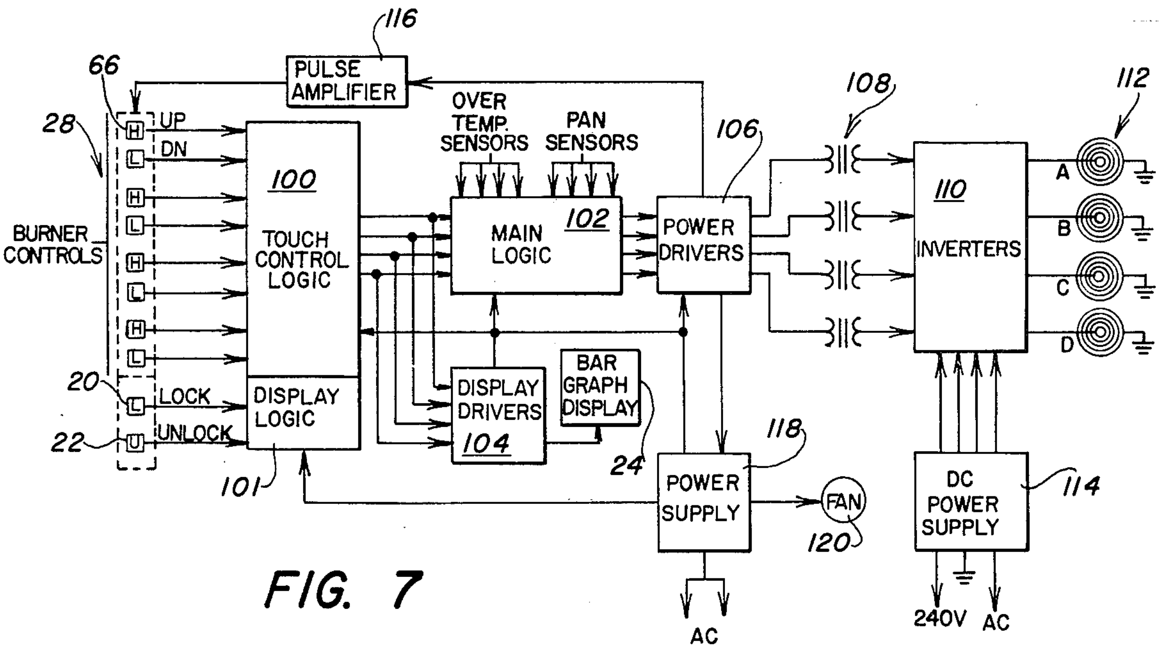
FIG. 7 is an electrical block diagram of the electrical control and logic circuitry of the present touch control circuitry and the induction cook-top of the invention.

FIG. 7 illustrates a block diagram of the electrical circuitry of the present induction cook-top. The burner controls 28 include the LOCK pad 20 and the UNLOCK pad 22, in combination with the four pairs of HI and LO burner control pads previously described. The pads are associated with copper areas 38–44 and 48–62, previously described. When one of the burner control pads is touched by the finger of the operator, the copper areas generate an electrical logic signal which is applied to touch control logic 100. Similarly, when the LOCK or UNLOCK pads are touched, signals are sensed by display logic 101. Logic 100 detects which of the pads was touched and provides logic control signals to main logic 102 and to display drivers 104. Signals are applied from over temperature sensors and pan sensors located adjacent each of the cooking units to the main logic 102. Main logic 102 generates control signals which are applied to power drivers 106 which generate selected electrical power signals through four transformers 108 to four inverters 110. The outputs of the inverters 110 are applied to the designated one of the four induction coils 112 A–D which are located beneath the cook-top surface 12 in the vicinity of the cooking units A–D. AC power is applied to a DC power supply 114 which is applied to power the inverters 110 in the manner to be subsequently described.

A pulse generator is included in the power drivers 106 and generates a pulse train which is applied through a pulse amplifier 116 to the burner controls 28. AC power to applied to a second power supply 118 which operates a fan 120 located within the interior of the cook top. Power supply 118 also provides power for the touch control logic 100, main logic 102 and the power drivers 106.

Figure 8:
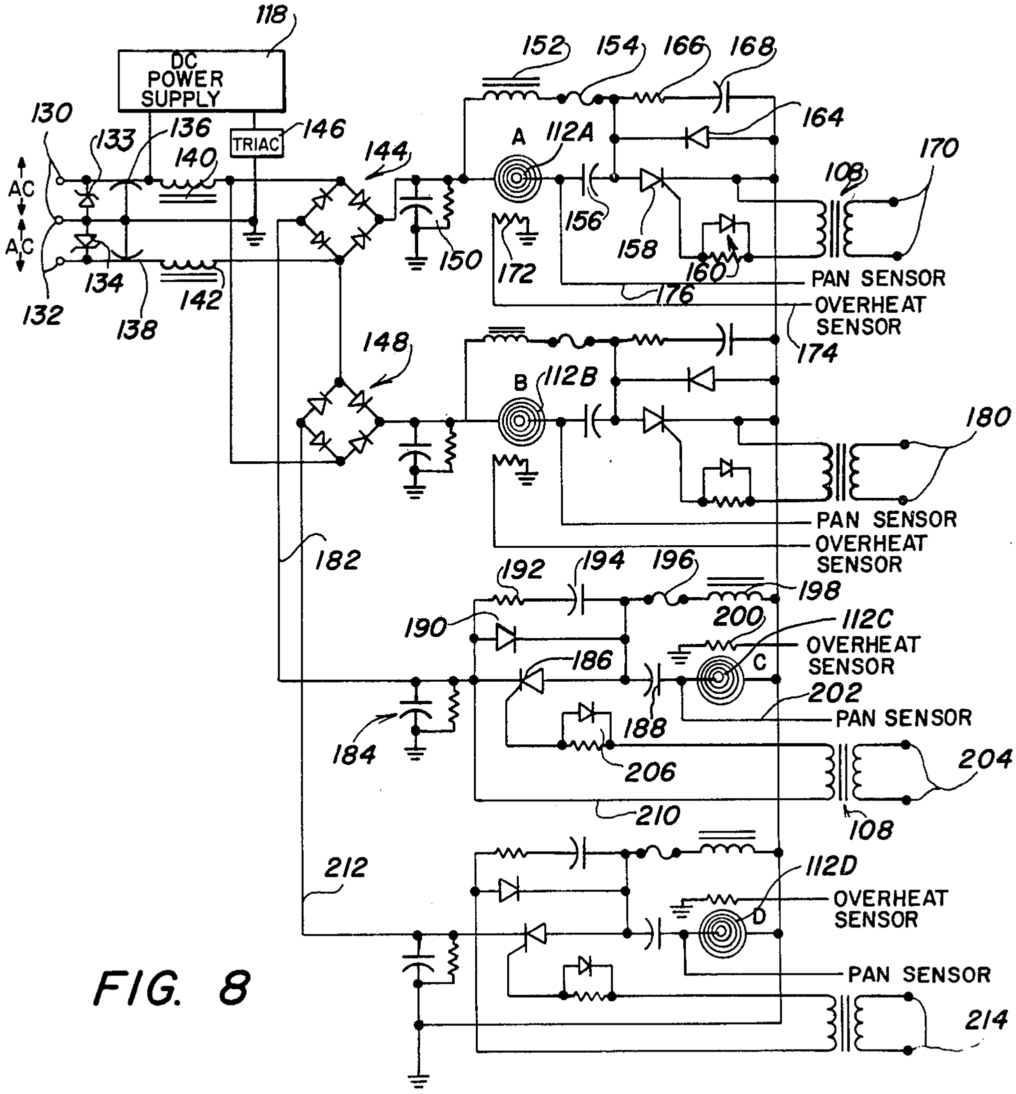
FIG. 8 is a schematic diagram of the power driver, inverter and induction heating coil circuitry of the invention.

FIG. 8 is a schematic diagram of the inverters and the four induction coils shown in FIG. 7. Wound induction coils 112 are designated A, B, C and D and correspond with the cooking units, A, B, C and D previously shown in FIG. 1. For example, the coil 112A is disposed directly beneath the ceramic layer 12 beneath the cooking unit A shown in FIG. 1. The control circuits for coils A and B are identical, while the control circuits for coils C and D are identical. As will be subsequently described, the circuits for driving coils A and B are connected in an opposite manner to the control circuitry for coils C and D in order to prevent ringing and overshoot of gating pulses.

Positive and negative AC voltages are applied across the terminal pairs 130 and 133. Zener diodes 133 and 134 are connected across the input AC lines, along with capacitors 136 and 138. Chokes 140 and 142 are connected in series with the input AC lines and are each connected at opposite points to a full-wave rectifier bridge 144 comprised of four diodes and connected in the well-known manner.

The DC power supply 118, previously noted in FIG. 7, is connected across the input AC lines and includes a triac semiconductor switch 146 connected between the power supply 118 and circuit ground.

Chokes 140 and 142 are also connected to opposite points of a second full-wave rectifier bridge 148. Rectifier bridge 144 is connected to the outer terminal of an induction coil 122A. An RC network 150 is connected between the bridge 144 output and circuit ground. An inductor 152 is connected around the coil 112A and is connected in series with a fuse 154. Coil 112A is connected at the center terminal thereof to a capacitor 156 which is connected to the anode of an SCR 158. The gate of the SCR 158 is connected through a resistor diode configuration 160 to a transformer 108 (FIG. 7). The second terminal of transformer 108 is connected to the cathode of the SCR 158. The cathode of SCR 158 is also connected to AC circuit ground. A diode 164 is connected across the anode and cathode of the SCR 158. A resistor 166 and capacitor 168 are connected in series across the diode 164. Terminals 170 of transformer 108 are connected to one of the four power drivers in the power driver circuit 106 previously shown in FIG. 7.

A heat sensitive thermistor 172 is placed in proximity to the induction coil 112A. One terminal of the thermistor 172 is connected to circuit ground, while the remaining terminal of the thermistor 172 is connected via a lead 174 to the main logic 102 to cause the induction coil 112A to be turned off if a maximum safe operating temperature is exceeded, such as would occur if a pot boiled dry.

The operation of the inverter and induction coils of the invention will be apparent. The full-wave rectifier 144 applies a suitable DC voltage for suitable biasing of the circuitry. Gating signals are applied from the logic to be subsequently described in FIG. 9 through the transformer 108 to the gate of the SCR 158. The series RC circuit, including resistor 166 and capacitor 168, is provided for dv/dt protection to limit the rate of reapplication of forward voltage to the device. The power circuit of the invention further includes the commutating capacitor 156 and the induction heating coil 112A.

Upon application of a gating pulse from transformer 108, a cycle of current flow is initiated, wherein the conduction heating coil 112A and the capacitor 156 form a series resonant circuit for generating damped sinusoidal current pulses that flow through the induction heating coil 112A. The reset induction coil 152 serves to reset the commutating capacitor 156 by charging the capacitor positively. The high frequency gating pulse is applied through the transformer 108 to control the amount of heat generated by the coil 112A.

The cooking pan set adjacent the induction heating coil 112A is seen by the circuit as a secondary winding having a series resistance. The induction heating coil 112A functions as the primary winding of an air-core transformer. The cooking pan provides an inductance which forms a part of the total inductance of the high frequency resonant circuit of the inverter. The commutating capacitor 156 and the coil 112A comprise a resonant circuit which is tuned to the desired resonant frequency to provide the desired operating range, which is generally within the range of 18 kHz to 40 kHz.

It will be understood that when a cooking utensil is removed from adjacent the coil 112A, the total inductance of the system increases and therefore a change in the resonant frequency of the series resonant circuit is provided. This change of frequency is indirectly detected by detection of a changing voltage via a lead 176 by the logic circuit to indicate the removal of the pan.

For more detail on the construction and general operation of this general type of inverter using an SCR, reference is made to the article entitled "A Low Cost, Ultra-Sonic Frequency Inverter Using A Single SCR" by Neville Mapham, Application Note published by the Semiconductor Products Department of General Electric, No. 20049, published February 1967. For a description of the use of SCR inverter circuits with an induction heating system, reference is made to U.S. Pat. No. 3,637,970 entitled "Induction Heating Apparatus", issued Jan. 25, 1972, U.S. Pat. No. 3,697,716 entitled "Induction Cooking Power Converter With Improved Coil Position", issued Oct. 10, 1972 and U.S. Pat. No. 3,823,297 entitled "Load Controlled Induction Heating", issued July 9, 1974.

The inverter circuitry interconnected with induction heating coil 112B is identical to the circuitry described above relative to coil 112A, except that it is interconnected to the full-wave rectifier bridge 148. Gating signals are applied to the inverter circuit via terminals 180 from the logic circuitry to be subsequently described.

Induction heating coil 112C includes inverter circuitry which is essentially a mirror image of the previously described circuitry. DC voltage is applied to the inverter from the fullwave rectifier bridge 144 via lead 182. An RC network 184 is connected between lead 182 and circuit ground. An SCR 186 is connected in series with a commutating capacitor 188 which is connected to the center of the induction heating coil 112C. The cathode of SCR 186 is connected to AC circuit ground through the capacitor in the RC network 184. The outside terminal of the coil 112C is connected to circuit ground. A diode 190 is connected across SCR 186 and a resistor 192 and capacitor 194 are connected in series across the diode 190. A fuse 196 is connected in series with an inductor 198 across the commutating capacitor 188 and the coil 112C. A heat sensitive resistance 200 is disposed adjacent the coil 112C to provide an overheating electrical indication. The presence of a cooking pan is sensed via lead 202 by detecting the change of inductance as previously described.

Gating signals are applied from the logic circuitry to be subsequently described via terminals 204 and are applied through a transformer 108 and through a resistance diode circuit 206 to the gate of the SCR 186. The other terminal of the transformer 108 is connected via lead 210 to the cathode of the SCR 186.

The inverter circuitry associated with the induction heating coil 112D is identical to that shown with respect to coil 112, and will thus not be described in detail. The inverter associated with coil 112D is connected to receive direct voltage from the full-wave rectifier 148 via lead 212. The inverters associated with the coil 112D receive gating signals from the logic circuitry to be subsequently described via terminals 214.

An important aspect of the present invention is that the inverters and coils 112A and 112B are connected in a mirror configuration with associated coils 112C and 112D. This mirror interconnection has been found to substantially eliminate ringing and overshoot associated with the gate pulses applied to the inverters when a positive power supply is utilized. It is necessary according to the invention to use both positive and negative AC power supplies to obtain a balanced load on the lines. With such positive and negative power supplies, it has been found that if all inverters and coils are connected in an identical manner, severe cross talk and ringing can occur. The present mirror image connection maintains the cathode of each of the SCRs at AC circuit ground and eliminates floating SCR cathodes and thus eliminates cross talk and ringing during operation of the system.

Figure 9:
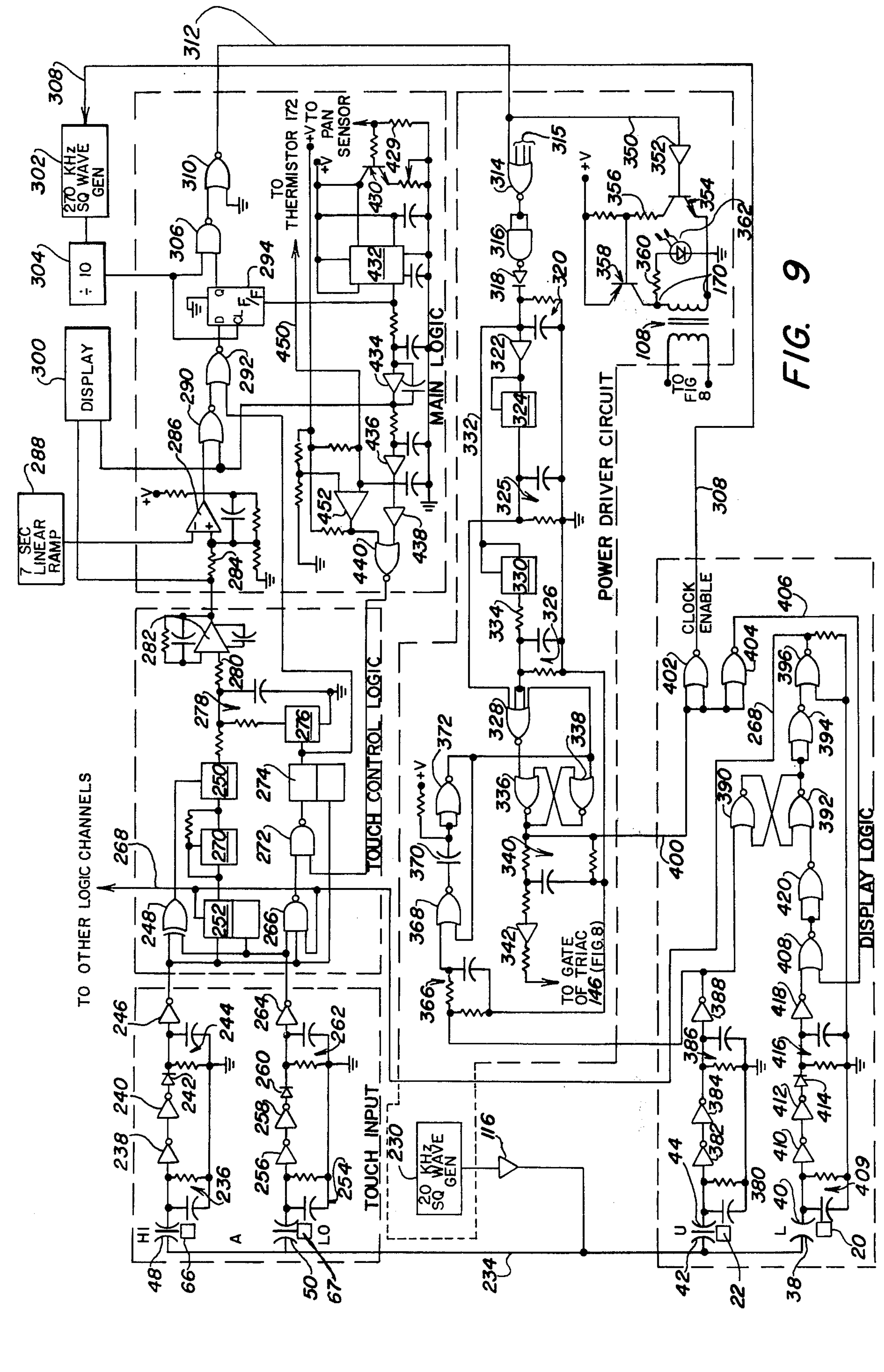
FIG. 9 is a schematic diagram of the logic circuitry of the invention.

FIG. 9 illustrates in schematic detail circuitry common to each of the four separate power drivers and inverters and induction heating coils, but illustrates only circuitry necessary to provide operation to a single induction heating coil for ease of illustration and explanation. The circuitry necessary to operate the additional induction heating coils shown in FIG. 8 will be identical to that shown in FIG. 9.

Referring to FIG. 9, the HI and LO burner controls for the cooking unit A are shown. The HI touch control includes the pad 66 previously shown in FIG. 3, in conjunction with the copper areas 48 which are disposed adjacent the two. Similarly, the LO pad 67 is disposed adjacent the pair of copper pads 50 previously shown in FIG. 3. A 20 kHz square-wave generator 230 applies a square-wave through the amplifier 116 (FIG. 7) and via lead 234 to the copper areas 48 and 50. The copper area 48 is connected through an RC filter network 236 and through two series connected inverters 238 and 240 and a diode 242. The signal is then applied through a second RC network 244 and through an inverter 246 to an input of an exclusive OR gate 248. The output of gate 248 is applied to a quad bilateral switch 250, which may comprise for example a CD 4016A RCA switch. The output from inverter 246 is also applied to quad three-state R/S latch 252, which may comprise for example a CD 4043 RCA latch.

The second of the copper areas 50 associated with the LO touch control switch is applied through an RC circuit 254 and through two series connected inverters 256 and 258 and a diode 260 to a second RC circuit 262. The signal is then applied through an inverter 264 to the input of a NAND gate 266. The output from inverter 264 is also applied to the quad three-state R/S latch 252. An output from the latch 252, and an input from gate 266 is applied to lead 268 which is applied to the logic channels for the other three induction heating coils 112B–D associated with the system. As noted, the logic channels for the remaining three coils is identical to that shown in FIG. 9.

The output from the latch 252 is applied to a quad bilateral switch 270 which may comprise a CDC 4016A RCA switch. The output of switch 270 is connected to switch 250. The output of gate 266 is applied through a NAND gate 272, the output of which is applied to a quad three-state R/S latch 274. The output of the latch 274 is applied to a quad bilateral switch 276 which is interconnected to the output of the switch 250 by an RC network generally identified by the numeral 278. The RC network 278 is connected via a resistor 280 to the input of an operational amplifier 282, which may comprise for example, a CA3140 operational amplifier, along with associated RC circuitry.

The output of the operational amplifier is applied through a resistance 284 to an operational comparator 286. A seven second linear ramp generator 288 generates a linear ramp having a seven second period which is applied to the negative input of the comparator 286. The output of the comparator is applied through NOR gates 290 and 292 to a dual D-type flip-flop 294, which may comprise for example a DC 4013 flip-flop. The bar graph display 300 of the invention is connected to the output of the operational amplifier 282 and to an input of gate 290. The bar display comprises the logic and four bar graph displays 46 previously described. The illustrated circuitry controls the up and down movement of the bar graph representing the cooking unit 112A and moves up and down in dependence upon contact of the operator's finger with the HI and LO pads.

A 270 kHz square-wave generator 302 generates a square-wave which is divided by ten by a divider 304 and which is applied to the flip-flop 294 and to an input of a NAND gate 306. The square-wave generator 302 is enabled by an enable signal applied via lead 308 from circuitry to be subsequently described.

The output of NAND gate 306 is applied to the input of a NOR gate 310, the output of which is applied via a lead 312 to one of four inputs to a NOR gate 314. Gate 314 also receives inputs from the three other induction coil logic channels at inputs 315. The output of gate 314 is applied through a NAND gate 316 and through a diode 318 to an RC network 320. A buffer 322 is connected to the RC network 320 and is connected to a bilateral switch 324. The output of the switch 324 is applied through an RC network 325 and to an input of a NOR gate 328. A bilateral switch 330 is connected via lead 332 to the RC network 320 and the output of switch 330 is applied through a resistor 334 and an RC network 326 to an input of gate 328.

The output of gate 328 is applied to a latch comprising interconnected NOR gates 336 and 338. The output of the latch is applied to an RC network 340 and through resistances and a buffer 342 to control the gate of the triac 146 previously shown in FIG. 8.

The gate pulses generated via lead 312 are applied via a lead 350 and through a buffer 352 to the base of a transistor 354. The collector of transistor 354 is applied through a resistance 356 to the base of a transistor 358. The output of transistor 358 is applied to one of the terminals 170 connected to the transformer 108 as described in FIG. 8. The transformer 108 amplifies the control pulses generated by the logic circuitry and applies them to gate the SCR 158 in order to control the operation of the induction heating coil 112A. The output of transistor 358 is also connected through a resistance 360 to a light emitting diode (LED) 362. The LED 362 becomes illuminated when gating pulses are being applied to the induction heating coil. The LED 362 may be viewed through an aperture formed in the cooking unit to enable ease of repair and maintenance by indicating when the gating circuit is operating properly.

A gate 368 receives an input from the unlock circuitry to be described. The output of gate 368 is applied through a capacitor 370 to the commonly connected inputs of a NOR gate 372. The output of gate 372 is applied back to the input of gate 368 and is also applied to an input of gate 338.

The display logic 101 previously described in FIG. 7 includes the UNLOCK pad 22 and the LOCK pad 20, along with the pairs of associated pads 38–40 and 42–44 previously shown in FIG. 3. The pad 44 is connected through an RC network 380 which is applied through two inverters 382 and 384 through an RC network 386. The output of the RC network 386 is applied through an inverter 388 to a latch comprising interconnected NOR gates 390 and 392. The output of the latch is applied through a NOR gate 394 to an input of a NOR gate 396. The output of gate 396 comprises a logic enable signal which is applied via lead 268 to the latch and to the input of gate 266 and to the remaining coil channels.

The output of inverter 388 is also applied through an RC network 366 to the input of NOR gate 368. The output from gate 336 is applied via lead 400 to the input of a NOR gate 402 to generate a clock enable signal which is applied via lead 308 to the square-wave generator 302. The output on lead 400 is also applied through a NOR gate 404 which applies a signal via lead 406 to the input of a NOR gate 408. The pad 40 associated with the LOCK touch control pad is connected via an RC network 409 through a pair of series connected inverters 410 and 412 and a diode 414. An RC network 416 is connected to the cathode of diode 414 and is applied through an inverter 418 to the input of gate 408. The output of NOR gate 408 is applied to the commonly connected inputs of a NOR gate 420, the output of which is applied to inputs of NOR gate 392.

The pan sensor signal described in FIG. 8 as being applied to lead 176 is applied through a resistor network 429 to the base of a transistor 430, the collector of which is applied to a timer 432 which may comprise, for example, a 555 timer. The output of the timer 432 is applied to flip-flop 294 to inhibit gate pulses to the SCR for periods of approximately one second, after which the flip-flop 294 is released to allow additional pulses to be applied. If the sensing circuit detects the absence of a pan for fifteen seconds, a shut-down signal is applied through three series connected buffers 434, 436 and 438 to an input of a NOR gate 440. The ouput of gate 440 is applied as a shut-down signal to the input of the gate 272.

The thermistor 172 which senses the heat of the coil, as shown in FIG. 8, is applied via lead 450 to the input of an operational amplifier 452, the output of which is applied to gate 440 in order to generate a shut-down signal in case of excess heat adjacent the burner.

In operation of the circuitry shown in FIG. 9, the 20 kHz square-wave pulses applied to the HI touchtone pad 48 appears inverted at the output of the inverter 238 as long as the HI pad 66 remains untouched by the finger of the operator. The signal is reinverted by inverter 240, rectified by diode 242 and maintains the output of the inverter 246 low. In a similar manner, when the LO pad is not touched by the finger of the operator, the output of inverter 264 is maintained at a logic low.

When the HI pad is touched by the finger of the operator, the input of the inverter 238 goes low and the high logic level is applied to inverter 240. Consequently, the output of inverter 246 goes logic high. Similarly, when the LO pad is touched, the output of the inverter 264 goes high.

Referring to the touch control logic, when the HI and LO pads are untouched, the inputs to the quad three-state R/S latch 252 are both low. When the HI pad is touched, the input applied to latch 252 from the inverter 246 goes high and the outputs from the latch go high, if a signal applied via lead 268 is high. Similarly, the input to gate 248 goes high while the input applied to gate 248 from inverter 264 is low, so the output of gate 248 goes high. Since both switches 270 and 250 are closed, all of the inputs and outputs of the switches go to a logic high. The capacitor in the RC network 278 charges through a charging resistance as long as the HI pad remains touched by the finger of the operator, until the capacitor is fully charged to a predetermined level. At this voltage level, the resistor connected across the switch 270 is bypassed by the switch 270. The bypassing of the resistor results in the bar display A 300 rising at a high rate. The voltage present on the capacitor appears at the output of operational amplifier 282 and remains constant after the finger is removed from the HI pad unless the LO pad is touched.

When the LO pad is touched without touching the HI pad, the input to latch 252 applied from inverter 264 goes high and the output of the latch goes low since the level applied on lead 268 from the display logic is high. The input to gate 248 from the inverter 264 is high, while the input to gate 248 from inverter 246 is low, so the output of the gate 248 goes high. The input to latch 274 from inverter 246 is low, thereby causing the output of the latch to go low and maintaining switch 276 open. The switch 270 is presented with a low at the inputs, thereby causing the switch to open. The signal applied to switch 250 from gate 248 is low, thereby closing switch 250. The capacitor in the RC network 278 now discharges through the resistances associated with the switches 270 and 250, since the switch 270 is open. The discharge from the capacitor continues until the capacitor is fully discharged or until the finger is removed from the LO pad. The voltage at the output of the operational amplifier 282 likewise decreases in step with the voltage on the capacitor 278. The operation of the switch 250 and 270 causes the bar graph display 300 to fall or reduce in length at a much slower rate than the display 300 rises, thus enabling ease and accuracy in setting the display at the desired level.

If both the HI and LO pads are simultaneously touched by the fingers of the operator, the input and output of the latch 252 go high. The inputs to the gate 248 are both high, so the output of gate 248 is low. The inputs to the switch 270 are high, while the signal applied to switch 250 from gate 248 is low, so switch 250 is open. All three inputs to gate 266 are high and thus the output of gate 266 goes low, thereby causing gate 272 to go high at the output thereof. The latch 274 goes high at the output thereof, thereby causing the switch 276 to be presented with a high at the input thereof to close switch 276. The capacitor associated with the RC network 178 rapidly discharges through its associated resistance and through the switch 276 to ground, thereby immediately causing the output of the operational amplifier 282 to go to zero. This causes the bar display 300 to be turned off and also causes the generation of gate pulses to be terminated, thereby immediately turning off the induction heating coil 112A.

If the step down output from gate 440 goes low, due to sensing of condition by the thermistor 172 or by the pan sensor, the output of gate 272 goes high, thereby causing the output of the latch 274 to go high. This causes the switch 276 to be closed and causing the induction heating coil to be deenergized immediately.

Referring to the main logic portion of the circuitry, the voltage from the operational amplifier 282 is compared with the voltage of the seven second ramp by the comparator 286. When the output from the operational amplifier 282 exceeds the ramp voltage, the output of the comparator 286 will go high. At all other times, the output of the comparator 286 is low.

When the output of the comparator 286 goes high, the output of gate 290 goes low and the output of gate 292 goes high. The input to the flip-flop 294 is thus high, and the output thereof goes high when the clock pulse applied to the flip-flop from the divider 304 goes high and remains high until the first clock pulse after the output of gate 292 goes low. The output from the flip-flop 294 is applied as a high level to the input of gate 306 and the 27 kHz clock pulse which is applied to gate 306 appears inverted at the output of gate 306. The inverted clock pulse is applied to gate 310 and is reinverted and appears at the output of gate 310 for application via lead 312 to gate 314.

When the output from the comparator 286 is low, the output of gate 290 goes high. Consequently, the output of gate 292 goes low and the output of the flip-flop 294 goes low when the clock pulse applied from divider 304 goes high and the output of the flip-flop stays low until the first clock pulse after the output of gate 292 again goes high. The output of gate 306 goes high, thereby causing the output of gate 310 to go low. If either the output from the comparator 286 goes low or the second input to gate 292 from latch 274 goes high, the output of the flip-flop 294 will go low and no clock pulses will appear at the output of gate 310. A high applied to the CL input of the flip-flop 294 will likewise prevent clock pulses from reaching the output of gate 310.

Referring to the pan sensor circuit, the voltage which appears across the induction heating coil 112A is applied via the lead 176 to resistors 429. The adjustable resistance tied to the emitter of transistor 430 is adjusted so that the proper size cooking pan on heating coil 112A presents a voltage to the resistor network 429 such that the transistor 430 will not be turned on.

However, the resistances 429 are provided with magnitudes such that the voltage across the induction heating coil 112A increases to turn on transistor 430, thereby applying negative pulses to the 555 timer 432. The first pulse triggers the timer 432 and the output from the timer 432 applied to the buffer 434 immediately goes high, as does the second output of the timer 432, thereby inhibiting any further gate pulses applied to the transformer 108 until the end of the predetermined one second timing period. After one second, the timer 432 resets and if the load cooking pan has not been replaced on the induction heating coil 112A by this time, the above-noted sequence is repeated. About 0.2 seconds after the output of the timer goes high, the input and output of the buffer 434 go high. This causes the input to gate 290 to go high, thus turning on the heating coil 112A for one full duty cycle. The same high signal also goes to the bar display 300 to turn the bar on and to cause it to flash while the pan is removed from the coil 112A. If the heating coil 112A remains unloaded by the pan for more than about 20 seconds, the output of the buffer 438 goes high, thereby causing the shut down line from the output of gate 440 to go low to turn the induction heating coil 112A off completely.

Referring to the bar display 300, a conventional bar display graph circuit and logic is utilized. The same control voltage that is applied to the main logic shown in FIG. 9 is also applied to the bar display A. This control logic is compared to an eight msec ramp voltage and during the time that the control voltage is higher than the ramp voltage, the bar display A will be energized. This causes the number of segments lit on the bar display A to be proportional to the control voltage and thus the temperature setting desired. When the pan sensor lead 176 goes high due to the pan being removed from the coil 112A, the bar display A 300 is completely lit and flashes until the pan is returned to the coil 112A or until the pan is left off the coil 112A for more than 20 seconds, at which time the coil 112A is completely turned off. As previously noted, the bar display is increased in length at a relatively high rate, but decreased in length at a slower rate in order to enable ease of adjustment.

Operation of the LOCK and UNLOCK touch pads is similar to the previously described operation of the HI and LO pads. For example, when the UNLOCK pad is touched by the finger of the operator, the input to inverter 382 goes low and the input to inverter 384 goes high. This causes the output of inverter 388 to go high and sets the flip-flop latch comprised of gates 390 and 392. This causes the output of gate 392 to go high and the output of gate 394 to go low. The output of gate 396 thus goes high, forcing the inputs to gates 402 and 404 to go high and forcing the output of gates 402 and 404 to go low. When the output of gate 402 goes low, the 270 kHz square-wave generator 302 is enabled. When the output of gate 404 goes high, the display logic is enabled.

When the LOCK pad 20 is touched by the finger of the operator, the output of inverter 418 goes high, causing the gate 408 output to go low and the output of gate 420 to go high. This causes the flip-flop comprising gates 390 and 392 to be reset and causes the output of gate 392 to go low. As soon as the outputs of gate 392 go low, the display logic circuits are inhibited and the touch pads of the system are all inoperative until the UNLOCK pad 22 is again touched.

Referring to the power driver circuit, when the UNLOCK pad 22 is touched by the finger of the operator, a high signal is applied from the inverter 388 to the RC network 366. If the operator's finger is held on the UNLOCK pad 22 for two or more seconds, the capacitor in the RC network 366 will charge to the high level and the input to gate 368 will go high. This causes the output of gate 368 to go low and the output of gate 372 goes high to set the flip-flop comprising gates 336 and 338. The output of gate 336 thus goes high. As soon as the capacitor in the RC network 340 charges, the output of buffer 342 goes high, thereby triggering the triac 146 shown in FIG. 8 and turning on the voltage, the power supply and the cooling fan.

The capacitor 370 holds the above-noted condition approximately 40 to 60 seconds, after which the output of gate 372 goes low. Unless one of the other inputs to gate 328 are high due to a coil being turned on, the output of gate 328 will go high, thereby resetting the flip-flop comprising gates 336 and 338 and causing the output of gate 336 to go low. This immediately activates the LOCK circuit through gates 402 and 404 and inhibits the 270 kHz square-wave generator 302. The capacitor in the RC network 340 then discharges and the output of the buffer 342 goes low and the power supply and the fan are thus turned off by deactivation of the triac.

As soon as an induction heating coil 112A is turned on, a pulse is applied to an input of gate 314. A pulse applied to the input of gate 314 will cause the output of the gate to go low at the pulse rate. The output of gate 316 goes high at the pulse rate and the diode 318 will rectify the pulse and the buffer 322 output will go high. The inputs and outputs of the bilateral switches 324 and 330 will all go high. The capacitor in the RC network 326 will charge rapidly and apply a high signal to the common pin input pins to gate 328. This causes the output of gate 328 to remain low even after the 40 to 60 second initial turn-on period has expired and will keep the power supply and fan operating by maintaining the triac 146 energized.

The capacitor in the RC network 325 will also charge, but at a slower rate, and apply a high signal to the input of gate 328. This high signal will remain on after all the induction coils 112A–D are turned off until the capacitor and RC network 325 discharges after about 3 to 4 minutes. When the capacitor is discharged to about 5 volts, the output of gate 328 will go high and turn off the power supply and the fan as described previously.

A pulse applied to an input of buffer 352 will turn on the transistor 354 which turns on the transistor 358, thereby driving the gate of the SCR shown in FIG. 8 through the pulse transformer 108.

The present invention has thus been described as an induction heating cook-top with many operational and functional improvements. The present cook-top includes an improved touch control system with many unique safety features which prevent accidental turn on and improper operation of the system. Further, the present system provides a very efficient and operational system and includes a mechanical structure which is advantageous over previously developed touch control systems. While the invention has been described with respect to a combination analog-digital hardwired system, it will be understood that the logic functions of the invention could be incorporated in a wholly digital microprocessor system.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. In an induction cooking system, the combination comprising:

a source of AC voltage;

rectifier means interconnected to said AC voltage source for generating a source of DC voltage;

a source of AC circuit ground potential;

first and second sources of gating signals;

first and second induction heating coils each having first and second terminals;

first and second semiconductor switches each having cathode, anode and gate terminals;

said first induction heating coil being connected between said source of DC voltage and said first semiconductor switch, such that said first induction heating coil first terminal is connected to said source of DC voltage and said first induction heating coil second terminal is connected to said anode of said first semiconductor switch;

said first semiconductor switch being connected between said first induction heating coil and said source of AC circuit ground potential, such that said first semiconductor switch gate terminal is connected to said first source of gating signals, said anode terminal is connected to said second terminal of said first induction heating coil and said cathode terminal is connected to said source of AC ground potential;

said second induction heating coil being connected between said second semiconductor switch and said source of AC circuit ground potential, such that said second induction heating coil first terminal is connected to said source of AC circuit ground potential and said second induction heating coil second terminal is connected to said anode terminal of said second semiconductor switch; and said second semiconductor switch being connected between said source of DC voltage and said second induction heating coil, such that said second semiconductor switch gate terminal is connected to said second source of gating signals, said anode terminal is connected to said second terminal of said second induction heating coil and said cathode is connected to said source of DC voltage.

2. The combination of claim 1 and further comprising:

a first capacitor connected between said first induction heating coil and said first semiconductor switch, and a second capacitor connected between said second semiconductor switch and said second induction heating coil.

3. The combination of claim 2 and further comprising:

a first inductance connected across said first induction heating coil and said first capacitor, and a second inductance connected across said second induction heating coil and said second capacitor.

4. The combination of claim 1 wherein said first and second semiconductor switches comprise SCRs.

5. The combination of claim 1 wherein said rectifier means comprises:

a bridge rectifier connected across said source of AC voltage.

6. The combination of claim 5 wherein said bridge rectifier comprises:

four diodes interconnected in a full wave rectifier configuration having first and second terminals, said first induction heating coil connected to said first terminal of said bridge and said second semiconductor switch connected to said second terminal of said bridge opposite said first terminal.

7. The combination of claim 1 and further comprising:

a capacitor connected between said source of AC circuit ground potential and said cathode terminal of said second semiconductor switch.

8. A touch control system for an induction cooking coil comprising:

an induction cooking coil, means for electrically energizing said coil, a first touch control pad for being touched to increase the output of said energizing means to raise the heating level of said coil, a second touch control pad for being touched to decrease the output of said energizing means to lower the heating level of said coil, an unlock touch control pad, circuitry for inhibiting the operation of said first and second touch control pads until said unlock touch control pad is touched for a predetermined time period, and means responsive to the initial application of power to said control system for inhibiting the operation of said first and second touch control pads until said unlock touch control pad is touched.

9. A touch control system for an induction cooking coil comprising:

an induction cooking coil, means for electrically energizing said coil, a first touch control pad for being touched to increase the output of said energizing means to raise the heating level of said coil, a second touch control pad for being touched to decrease the output of said energizing means to lower the heating level of said coil, an unlock touch control pad, circuitry for inhibiting the operation of said first and second touch control pads until said unlock touch control pad is touched for a predetermined time period, and a lock pad for being touched to lock said first and second touch control pads at their existing levels.

10. A touch control system for an induction cooking coil comprising:

an induction cooking coil, means for electrically energizing said coil, a first touch control pad for being touched to increase the output of said energizing means to raise the heating level of said coil, a second touch control pad for being touched to decrease the output of said energizing means to lower the heating level of said coil, an unlock touch control pad, circuitry for inhibiting the operation of said first and second touch control pads until said unlock touch control pad is touched for a predetermined time period, and said means for electrically energizing said coil is turned off when said first and second touch control pads are simultaneously touched.

11. A touch control system for an induction cooking coil comprising:

an induction cooking coil, means for electrically energizing said coil, a first touch control pad for being touched to increase the output of said energizing means to raise the heating level of said coil, a second touch control pad for being touched to decrease the output of said energizing means to lower the heating level of said coil, an unlock touch control pad, circuitry for inhibiting the operation of said first and second touch control pads until said unlock touch control pad is touched for a predetermined time period, a visual display of the energization of said cooking coil, means for flashing said visual display on and off during the absence of a pan from said cooking coil, means for sensing the absence of a pan adjacent said cooking coil, and means for deenergizing said cooking coil if said means for sensing senses the absence of a pan adjacent said cooking coil for a predetermined time interval.

12. The touch control system of claim 11 and further comprising:

means for sensing an excessive temperature of said cooking coil, and means responsive to said sensing means for deenergizing said cooking coil upon the sensing of said excessive temperature.

13. A cook-top bar graph display for indicating heat control, comprising:

a burner coil adapted to be energized to provide heat, a source of electrical signals for applying electrical energy to energize said coil, control means for raising and lowering the electrical energy applied to said coil from said source, a bar graph responsive to said control means for displaying a bar having a length representative of the electrical energy applied to said coil, circuitry associated with said control means for causing said bar graph to be increased in length at a faster rate than said bar graph is decreased in length to facilitate accurate setting of the heat level of said burner coil, and means responsive to the absence of a pan near said coil for causing said bar graph to flash on and off.

14. A cook-top bar graph display for indicating heat control comprising:

a burner coil adapted to be energized to provide heat, a source of electrical signals for applying electrical energy to energize said coil, control means for raising and lowering the electrical energy applied to said coil from said source, a bar graph responsive to said control means for displaying a bar having a length representative of the electrical energy applied to said coil, and circuitry associated with said control means for causing said bar graph to be increased in length at a faster rate than said bar graph is decreased in length to facilitate accurate setting of the heat level of said burner coil.

15. The cook-top bar graph display of claim 14 wherein said control means comprises:

first and second touch control pads responsive to being touched for controlling the energization of said coil and for controlling the length of said bar graph.

16. The cook-top bar graph display of claim 14 and further comprising:

means responsive to the absence of a pan near said coil for causing said bar graph to flash on and off.

* * * * *

UNITED STATES PATENT AND TRADEMARK OFFICE
CERTIFICATE OF CORRECTION

PATENT NO. : 4,169,222

DATED : September 25, 1979

INVENTOR(S) : Raymond M. Tucker

It is certified that error appears in the above-identified patent and that said Letters Patent are hereby corrected as shown below:

Column 7, line 67, "power to applied to" should be --power is applied to--.

Column 8, line 33, "122A" should be --112A--.
Column 10, line 11, "112" should be --112C--.
Column 13, line 54, "switch" should be --switches--.
Column 14, line 2, "178" should be --278--.

Signed and Sealed this

*Fifth* Day of *February 1980*

[SEAL]

*Attest:*

SIDNEY A. DIAMOND

*Attesting Officer* *Commissioner of Patents and Trademarks*